US006225011B1

(12) United States Patent
Gotoh et al.

(10) Patent No.: US 6,225,011 B1
(45) Date of Patent: May 1, 2001

(54) METHOD FOR MANUFACTURING SEMICONDUCTOR DEVICES UTILIZING PLURALITY OF EXPOSURE SYSTEMS

(75) Inventors: Yasuko Gotoh, Kokubunji; Norio Hasegawa, Tokyo; Naoko Asai, Higasimurayama; Katsuya Hayano, Ome; Takashi Matsuzaka; Katsuhiro Kawasaki, both of Hitachinaka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/294,428

(22) Filed: Apr. 20, 1999

(30) Foreign Application Priority Data

Apr. 22, 1998 (JP) .................................... 10-111746

(51) Int. Cl.[7] ........................................................ G03F 9/00
(52) U.S. Cl. .............................. 430/22; 430/30; 430/296; 430/328; 430/942
(58) Field of Search ............................. 430/30, 296, 942, 430/22, 328

(56) References Cited

U.S. PATENT DOCUMENTS 5,631,113 * 5/1997 Satoh et al. ............................ 430/30
5,945,239 * 8/1999 Taniguchi ............................... 430/30
5,972,541 * 10/1999 Sugasawara et al. .................. 430/30
5,976,737 * 11/1999 Oka ........................................ 430/30

FOREIGN PATENT DOCUMENTS 62-149127   7/1987  (JP) .

OTHER PUBLICATIONS

Japanese Journal of Applied Physics, Series 4, Proc. of 1999 Inter. Micro–Process Conference, pp. 58–63.
SPIE, vol. 2725, pp. 414–423.

* cited by examiner

*Primary Examiner*—Christopher G. Young
(74) *Attorney, Agent, or Firm*—Mattingly, Stanger & Malur, P.C.

(57) ABSTRACT

A pattern can be written in accordance with a distortion which changes depending upon exposure conditions of the optical exposure system and exposed pattern features, and a pattern can be written with a high alignment accuracy by the optical exposure system and an electron beam lithography system or two optical exposure systems. A pattern which is exposed by optical exposure system divided into very small areas shown by broken lines, and pattern feature amounts (fx), (fy) at each area are calculated. A correction amount is obtained by using the pattern feature amount and the position within an exposure field as parameters based on exposure distortion examined by a standard pattern predeterminedly.

10 Claims, 13 Drawing Sheets

FIG. 1A
FIG. 1B
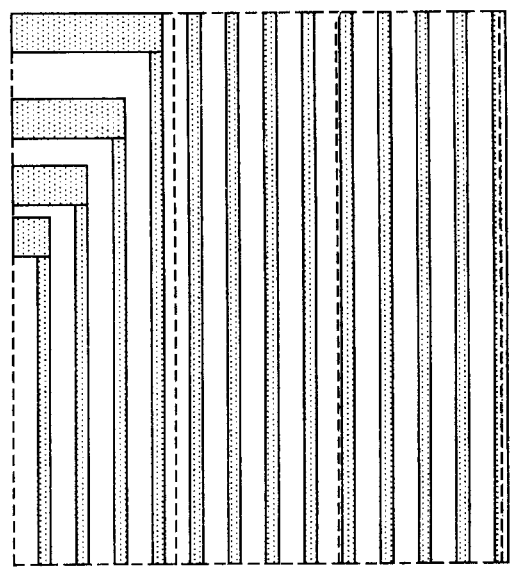
| fx(i0,j2) fy(i0,j2) | fx(i1,j2) fy(i1,j2) | fx(i2,j2) fy(i2,j2) |
|---|---|---|
| fx(i0,j1) fy(i0,j1) | fx(i1,j1) fy(i1,j1) | fx(i2,j1) fy(i2,j1) |
| fx(i0,j0) fy(i0,j0) | fx(i1,j0) fy(i1,j0) | fx(i2,j0) fy(i2,j0) |
FIG. 1C
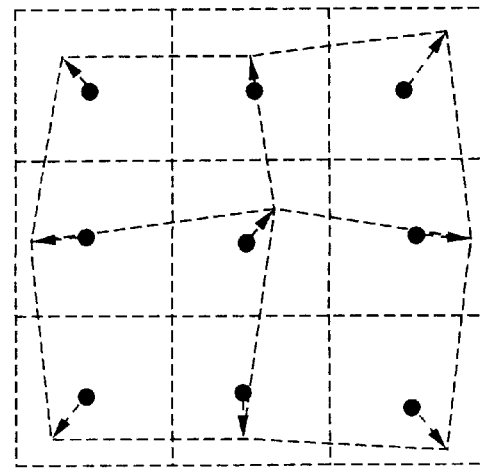

FIG. 6A
FIG. 6B
FIG. 7
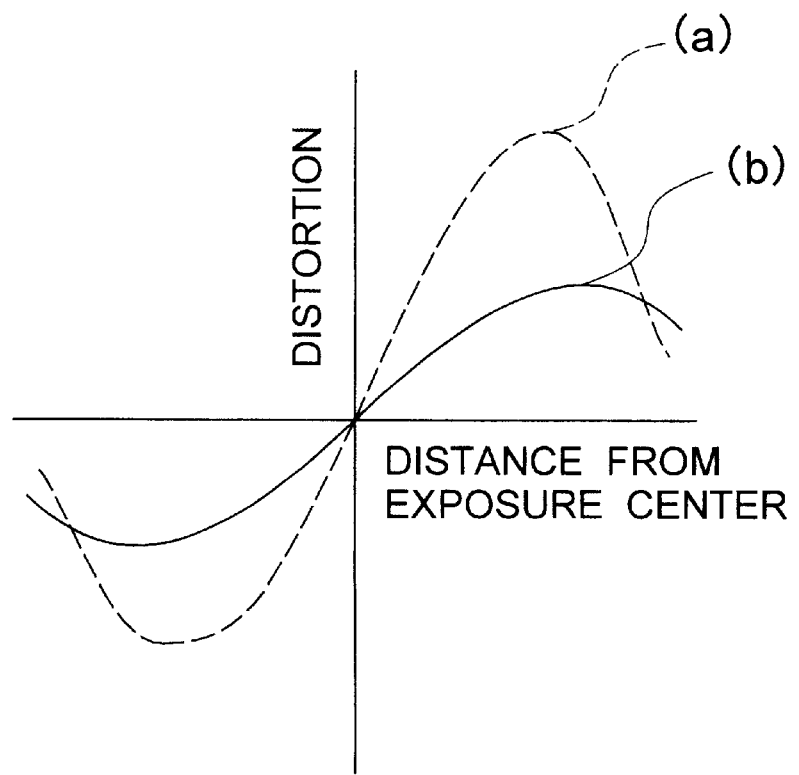

ENLARGED-SCALE

METHOD FOR MANUFACTURING SEMICONDUCTOR DEVICES UTILIZING PLURALITY OF EXPOSURE SYSTEMS

BACKGROUND OF THE INVENTION

The present invention relates to a semiconductor manufacturing method and a semiconductor manufacturing apparatus for manufacturing a semiconductor integrated circuit by forming different pattern layers of semiconductor integrated circuits with different pattern exposure systems, and particularly to a semiconductor manufacturing method and a semiconductor manufacturing apparatus in which a reliability can be increased by increasing an alignment accuracy among the respective pattern exposure systems, and semiconductor devices manufactured by such semiconductor manufacturing method and semiconductor manufacturing apparatus.

Heretofore, in the semiconductor manufacturing process using a pattern exposure system (using lithography technologies), there exist a large number of working processes in which there is alignment of the patterns formed on the semiconductor wafer in the preceding process and new different patterns are formed on the previously-formed pattern. Recently, there is an increasing demand for more microminiaturization with respect to these lithography technologies. As described in "Japanese Journal of Applied Physics (J.J.A.P.)" Series 4, Proc. Of 1999 Intern. Micro-Process Conference pp. 58–63, for example, a method is described in which layers required to have high resolution are formed by an electron beam lithography system and other layers are formed by other lithography systems (exposure system) such as a stepper using i rays or an excimer laser as a light source, i.e. a mix-and-match manufacturing method. In such a mix-and-match manufacturing method, the most important factor to consider is alignment accuracy between the layer exposed by the optical exposure system and the layer lithographed by electron beams.

FIG. 2 is a diagram showing an example of a method for accomplishing alignment lithography.

In the aforementioned mix-and-match manufacturing method, an example of a method of accomplishing alignment lithography on an underlayer pattern will be described with reference to FIG. 2. As shown in FIG. 2, on a wafer 1, there is formed a layer (a plurality of chips 3, etc.) exposed by an optical projection exposure system (hereinafter simply referred to as an optical exposure system). On this layer, there are previously exposed alignment marks 2 used in lithography alignment of the next layer together with the underlayer. These marks 2 are located at four corners of the chip 3. The position on the wafer 1 is visually confirmed by detecting the positions of these four marks 2 using an electron beam scanning or optical method.

FIG. 3 is a perspective view showing an optical exposure system and FIG. 4 is a diagram showing characteristics of a pattern exposed by the optical exposure system.

In the optical exposure system, as shown in FIG. 3, there is used an aperture 4 for uniformly converging incident light of a specific shape. Light projected from the aperture 4 is irradiated through a lens 5 onto a mask 6, a projected image is generated by projecting a pattern lithographed on the mask 6, and this projected image is demagnified by a demagnification lens comprising a plurality of lenses and then developed on the wafer 1.

A field exposed on the wafer 1 becomes a distorted pattern shown in FIG. 4 by optical characteristics of the demagnification lens 7. That is, as compared with a plan shown by broken lines, the pattern exposed in actual practice becomes a distorted shape as shown by solid lines in FIG. 4.

When a semiconductor integrated circuit is manufactured, since a relative positional relationship between the exposed pattern and the underlayer becomes important, the lithography position of the next layer should be corrected in accordance with the distortion of the pattern exposed by the optical exposure system. There are available two correction methods. One correction method is to align the exposed pattern and the underlayer by lithographing the next layer into a pattern having the same distortion in accordance with the distortion of the exposed pattern (alignment lithography). The other correction the method is to correct mask 6 itself by reverse-correcting the plan in order to remove the distortion from the exposed pattern so that the underlayer and other layers are developed on the wafer 1 by the demagnification lens 7 (mask lithography).

The technology for achieving such correction is described in JP-A-62-149127, for example. According to this technology, as shown in FIGS. 5A and 5B, a mask 6 in which distortion measurement marks 8 are disposed on the whole of the exposure area at a constant pitch in a lattice fashion is transferred onto the wafer 1 by a pattern exposure system. Then, mark position data is memorized by scanning the positions of the distortion measurement marks 8a formed on this wafer 1 with electron beams, exposure distortion data is obtained from that stored data, and the exposure positions of charged beams are corrected in accordance with distortion data. That is, there is used the above-mentioned latter method.

Recently, as the minimum work dimension of integrated circuit is increasingly reduced, a required alignment accuracy becomes approximately 50 nm and becomes more severe. Therefore, how to accurately measure the distortion of the underlayer and how to accurately correct the distortion in the alignment lithography become important problems. In addition, since the shape of the positional distortion of the pattern exposed by the optical exposure system and the distortion amount are not constant, as described in "SPIE Vol. 2725", p. 417, it becomes clear that the shape of the positional distortion and the distortion amount become different due to characteristics of the exposed pattern at the nanometer level.

FIGS. 6A and 6B are diagrams used to explain features of patterns exposed by the optical exposure system. FIG. 7 is a diagram used to explain a difference between distorted states of the patterns produced by the optical exposure system.

When a pattern comprising lines and spaces (comprising a plurality of lines) shown in FIG. 6A is transferred or when an isolated pattern shown in FIG. 6B is transferred, for example, the distorted amounts of the transferred patterns become slightly different from each other depending upon the patterns. The reason for this is that light diffracted when traveling through the mask is exposed on the underlayer at different positions of the lens in the patterns with different spatial frequencies.

The distortion amount of the optical exposure system changes mainly depending upon the position of the exposure field of the optical exposure system. Specifically, the distortion obtained when the pattern shown in FIG. 6A is transferred has a distortion shown by a broken line (a) in FIG. 7, while the distortion obtained when the pattern shown in FIG. 6B is transferred has a distortion shown by a solid line (b) in FIG. 7. A difference between the two distortion amounts ranges from approximately 30 to 50 nm at maximum and a required alignment accuracy is less than approximately 50 nm so that a proper alignment cannot be made, which causes an extremely serious problem. Accordingly, even when the electron beam lithography pattern is corrected by the distortion as measured based on the conventional standard pattern, the pattern has different distortions depending upon the shape of the pattern of the underlayer so that the lithography pattern cannot be corrected appropriately.

As described above, the lens distortion amount of the optical exposure apparatus is determined by a combination of the position of the exposure field and the shape of the exposed pattern. Accordingly, when the pattern is exposed by a combination of different lithography techniques, i.e. the optical exposure system and an electron beam direct lithography system, according to the conventional method, the lithography pattern is not corrected by considering the exposure conditions and the pattern state of the underlayer, thereby making it difficult to expose the pattern by the combination of the optical exposure system and the electron beam direct lithography system at high accuracy under 50 nm.

While the above-mentioned problem has been described so far as a problem associated with high alignment accuracy in the combination of different exposure systems such as the electron beam lithography system and the optical exposure system, when a plurality of patterns are exposed together by the same optical exposure system, if the features of the pattern shapes are considerably different in the layers, then exactly the same problem will arise.

SUMMARY OF THE INVENTION

In view of the aforesaid aspect, it is an object of the present invention to provide a semiconductor manufacturing method in which the aforementioned problems encountered with the prior art can be solved and in which lithography can be made in accordance with the distortions changing depending upon the exposure conditions of the optical exposure system and the features of exposed patterns, even when the pattern is exposed by a mix-and-match of the optical exposure system and the electron beam lithography system and even when a plurality of patterns are exposed together only by the optical exposure system, the pattern can be exposed with less influence of lens distortion and semiconductor devices manufactured by such a semiconductor manufacturing method.

In order to attain the above-mentioned object, in the semiconductor manufacturing method according to the present invention, when the next layer is exposed by the electron beam lithography system in alignment with the layer exposed by using the optical exposure system, considering the position at which a graphic form is contained in the pattern exposed by the optical exposure system is disposed and the features of the graphic form, an amount of distortion generated upon actual exposure is calculated, and a pattern written by electron beams is distorted similarly to the distortion generated by the optical exposure system.

The position at which the graphic form contained in the above-mentioned pattern is disposed and the features of the graphic form are standard pattern exposures that are used to calculate a distortion within the exposure plane by the exposure system.

The above-mentioned exposure system means the optical projection exposure system and the electron beam lithography system.

Further, in a semiconductor manufacturing method comprising the steps of exposing the distortion correction standard pattern in advance by the optical projection exposure system, measuring the standard mark position of the wafer, correcting the writing position based on the measured distortion and writing a pattern by electron beams, the semiconductor manufacturing method is characterized by writing a pattern by adjusting a correction amount corrected by the electron beam lithography system in accordance with an optical distortion that changes in response to underlayer exposure conditions or an exposed pattern shape or both of the underlayer exposure conditions or the pattern shape when a distortion correction standard pattern is exposed.

Further, the distortion correction marks disposed within an exposure area in a lattice fashion are prepared in shapes of a plurality of kinds, and said shapes are those which can measure the change of the pattern exposure distortion.

Furthermore, the exposed distortion of the pattern is changed depending upon the spatial frequency of the pattern.

Furthermore, the optical projection exposure system exposes the distortion correction pattern standard pattern in advance, the standard mark position of the wafer is measured and the mask writing position is corrected in such a manner that the exposure distortion of the pattern exposed in the manufacturing process is minimized.

BRIEF DESCRIPTION OF THE DRAWINGS

FIGS. 1A, 1B, 1C are diagrams used to explain a pattern correction method according to an embodiment of the present invention;

FIGS. 6A and 6B are diagrams used to explain features of the patterns exposed by the optical exposure system;

FIG. 7 is a diagram useful for explaining a difference between distortion shapes of the patterns obtained by the optical exposure system in FIGS. 6A and 6B;

DETAILED DESCRIPTION OF THE EMBODIMENT

The present invention will hereinafter be described in detail with reference to the drawings.

FIGS. 1A, 1B, 1C are diagrams used to explain a pattern correction method according to an embodiment of the present invention.

FIG. 1A shows a pattern exposed by an optical exposure system, FIG. 1B shows calculated values of feature amounts of that area by dividing the exposed pattern shown in FIG. 1A, and FIG. 1C shows vectors and lines obtained when correction amounts are determined at every area based on the pattern features and pattern positions.

Portions shown in halftone in FIG. 1A show patterns that were already exposed by the optical exposure system. This underlayer pattern is divided into very small areas shown by broken lines in FIG. 1A, and pattern feature amounts fx, fy at the divided area (i, j) are shown in FIG. 1B. fx represents a feature amount and distortion data in the x-axis direction, and fy represents a feature amount and distortion data in the y-axis direction. A correction amount is previously obtained by simulation and measurement using the pattern feature amount and the position within the exposure field as parameters. In response to the feature amounts and positions thus calculated, the correction amounts at respective positions are determined at every area as shown by arrows and broken lines in FIG. 1C. According to the present invention, by setting the correction amounts based on the pattern features and the pattern positions as described above, it becomes possible to accurately correct the lithography pattern in accordance with the distortion of the optical exposure system.

Figure 8:
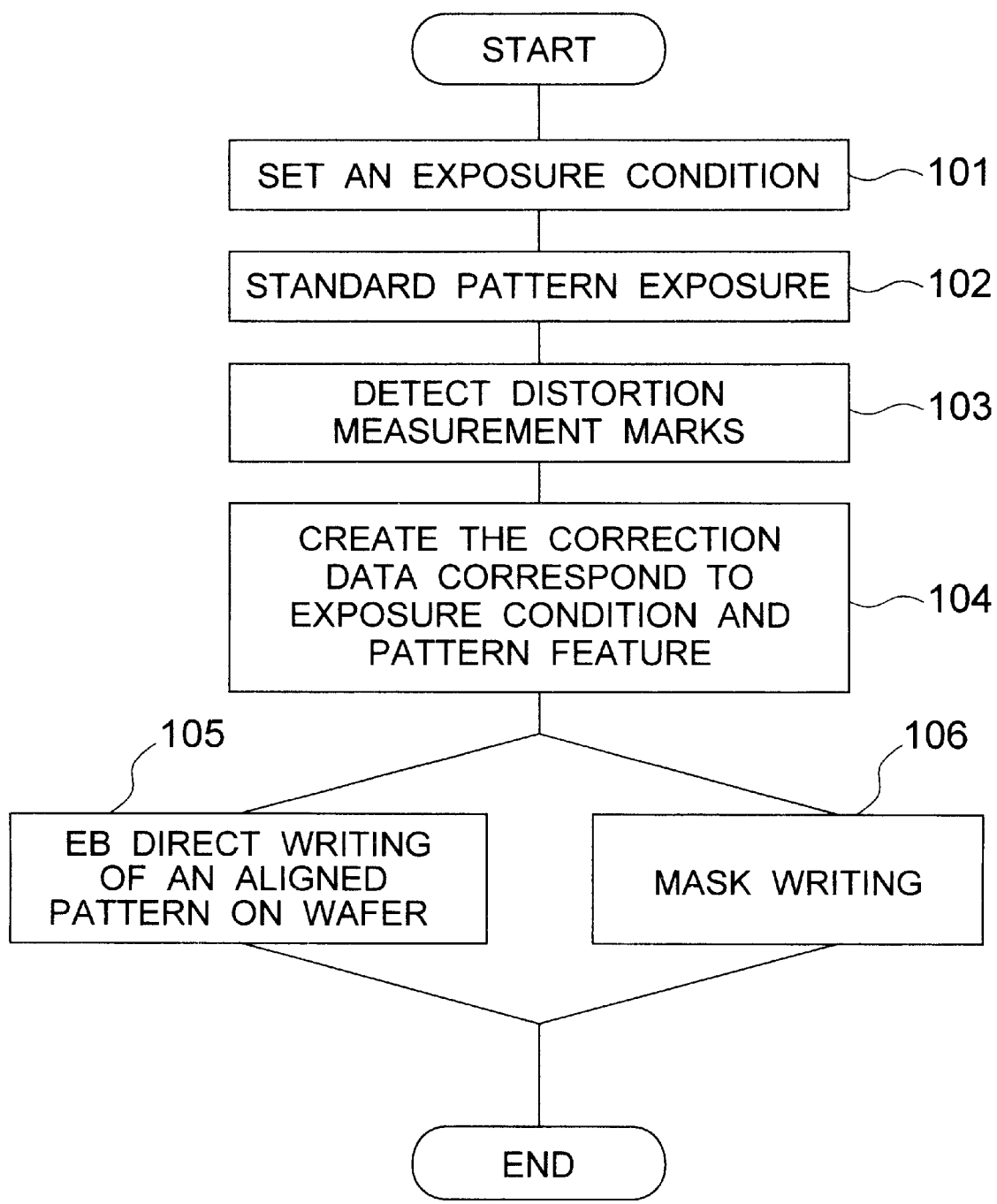
FIG. 8 is a flowchart of a semiconductor manufacturing method showing an embodiment of the present invention.

FIG. 8 is a flowchart to which reference will be made in explaining a semiconductor manufacturing method according to the embodiment of the present invention.

Initially, referring to FIG. 8, and following the start of operation, control goes to a step 101, whereat the optical exposure system sets an exposure condition similar to that under which a product pattern is exposed. The exposure conditions are various conditions such as states of light for exposing the pattern, shapes of stops and other ones matched with actual practice. Then, control goes to a step 102, whereat the standard pattern is exposed. A distortion measurement mark of a lattice shape is disposed on the standard pattern, and the exposure distortion of the optical exposure system can be measured by calculating a shift amount of the above-mentioned measurement mark from the ideal lattice of the mark position of the exposed pattern. As the distortion measurement mark, there are prepared a plurality of kinds of shapes in order to measure different distortions based on the pattern features.

Then, control goes to a step 103, whereat the distortion measurement mark position is measured. When the mark position is measured, there are used a position measuring device using light waves, for example, and a mark detection function of an electron beam lithography system. In order to inspect a distortion changing with features of the pattern, a plurality of kinds of marks are detected, and exposure distortions of the respective patterns are calculated. In another case, the mark position need not be detected. With respect to a distortion depending upon the feature of the pattern, an amount of distortion may be calculated by using simulation. Then, control goes to a step 104, whereat correction data depending upon the pattern is created based on the distortion measured results thus obtained. In accordance with the shape of graphics within the pattern being corrected, the distortion within the exposure field is re-calculated by the above-mentioned method and set in a memory apparatus of the electron beam lithography apparatus as a correction data file for correcting the lithography position.

Then, control goes to steps 105, 106, in which a pattern is written based on the correction data thus calculated. When the next layer is written in the layer exposed by the optical exposure system with the electron beam lithography system, a pattern is written in the layer by adjusting a deflection amount of beams in such a manner that the distorted pattern is aligned with a relative position of the distortion of the underlayer exposed by the optical exposure system (combined writing step 105). Also, when the next layer is exposed by the optical exposure system relative to the pattern exposed by the optical exposure system while the exposure condition and the pattern are changed, correction data is set in an electron beam mask lithography system in such a manner that a distortion obtained upon exposure may be minimized, and the mask pattern is written (mask writing step 106).

Figure 9:
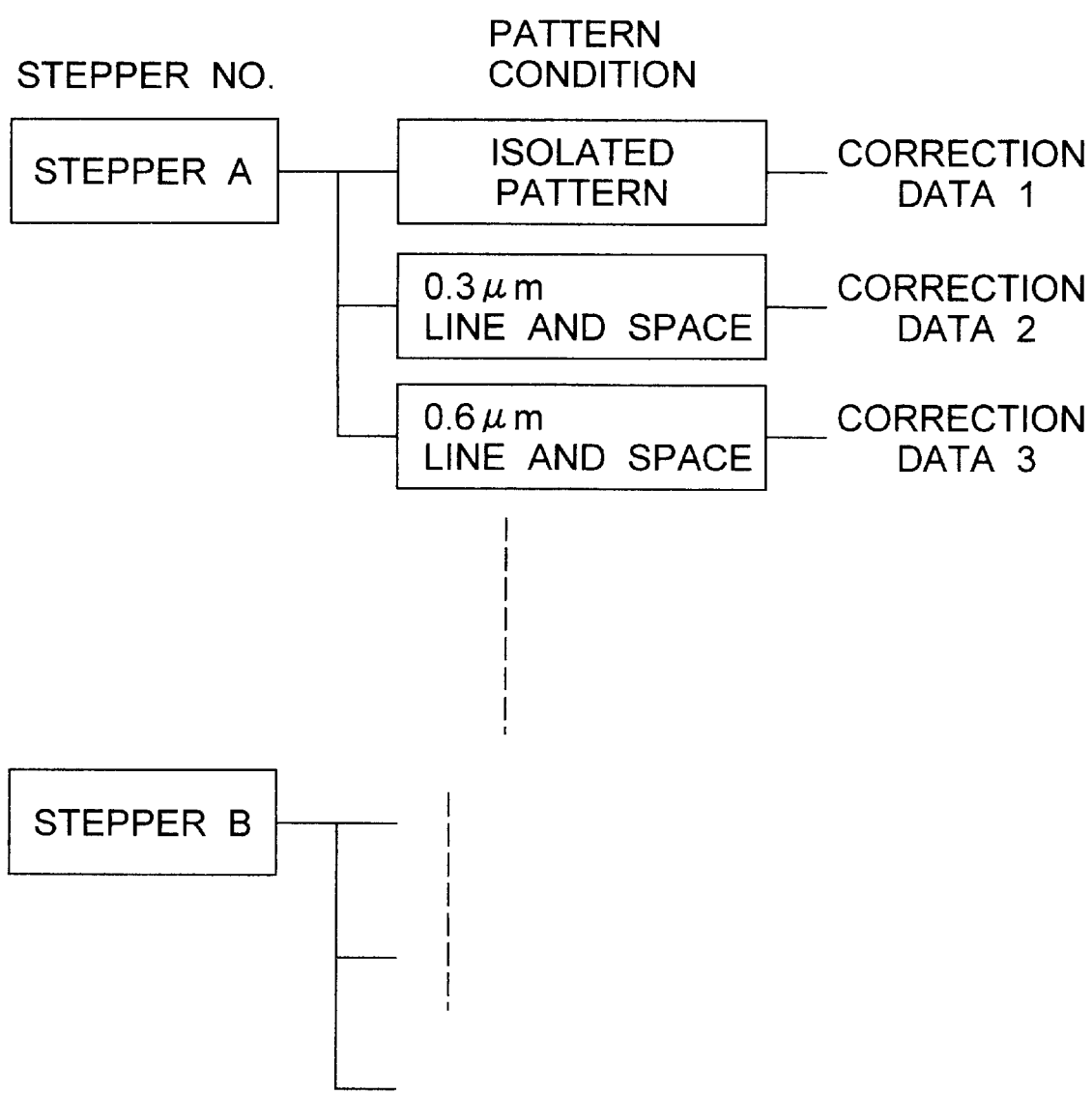
FIG. 9 is a schematic diagram showing a structure of correction data file according to the present invention.

FIG. 9 is a diagram showing a structure of the correction data file according to the present invention.

In the optical exposure system, since distortions at respective positions are determined based on steppers (steppers A, B, . . . ), features of patterns (isolated pattern, parallel pattern, etc.) and combinations of positions distant from the center of exposure (0.3 $\mu$m line and space, 0.6$\mu$ line and space, . . . ), the correction data file has the hierarchical structure shown in FIG. 9 so that correction data files are recorded on a variety of media represented by a hard disk and a flexible disk.

Figure 10:
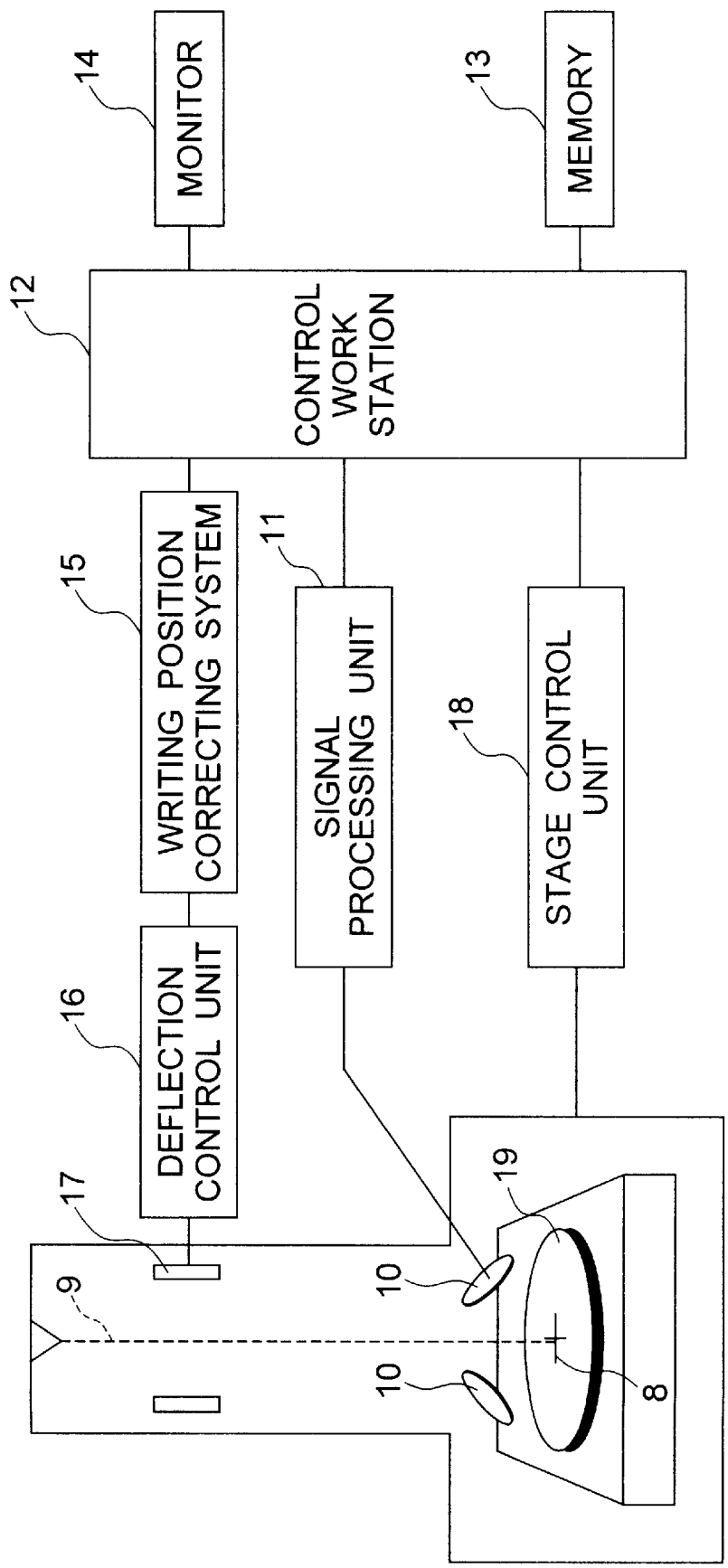
FIG. 10 is a schematic block diagram showing the system configuration of the electron beam lithography system according to the present invention.

FIG. 10 is a schematic block diagram showing the system of the electron beam lithography system to which the present invention is applied.

As shown in FIG. 10, in order to calculate a position of a mark 8 formed on a wafer 19, electron beams 9 scan the mark 8, reflected electrons generated by beam scanning are detected by a detector 10, a resultant signal is processed by a signal processor 11, and a computation for obtaining the mark position is executed. The mark position data is supplied to a control computer 12. In a memory 13, there is stored distortion correction data which is manufactured by eliminating a non-orthogonal component other than the distortion from the mark measurement position of the standard pattern. A display apparatus 14 is able to visually display measured distortion data and results obtained after the statistics processing. This distortion information and information of patterns being written are analyzed by the control computer 12 and transferred to a writing position correction circuit 15. The writing position correction circuit 15 computes an amount for correcting a writing pattern as a deflection amount of electron beams in such a manner that the writing pattern may be matched with the distortion of the underlayer. Based on the computed deflection amount of electron beams, a deflection control circuit 16 controls a deflector 17 so that electron beams 9 are deflected and irradiated on a sample 19 for writing.

The sample 19 is a wafer when a pattern is written directly and is a mask when the pattern exposed by the optical exposure system is corrected.

Figure 11A:
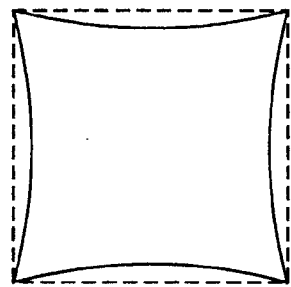
FIGS. 11A and 11B are diagrams used to explain a method of creating mask writing correction data according to the present invention.
Figure 11B:
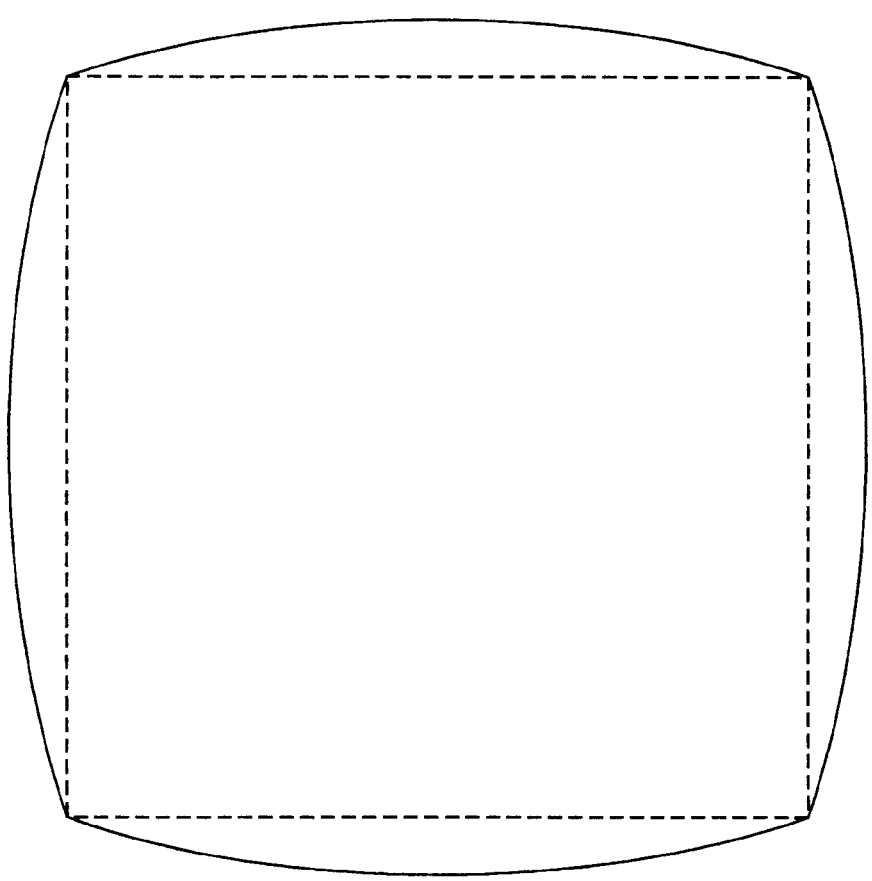

FIGS. 11A and 11B are diagrams used to explain a method of creating mask writing correction data according to the present invention.

A correction method used when a lens distortion amount of the exposed pattern is minimized by reflecting a correction on the mask will be described with reference to FIGS. 11A and 11B. When the exposed pattern has a lens distortion shown by a solid line in FIG. 11A relative to an ideal lattice shown by a broken line, as shown by the solid line in FIG. 11A, correction data is magnified in accordance with a mask magnification and correction data in which positive and negative polarities of data are reversed is set in the electron beam mask writing system, thereby writing the mask.

When the corrected mask is used and the pattern is exposed by the optical exposure apparatus, since the distortion component generated upon exposure is corrected in advance by the mask pattern, such distortion component is demagnified by optical characteristics of the demagnification lens, and the mask can be written as shown by the broken line in FIG. 11A. Thus, a satisfactory exposure with less distortion becomes possible.

Figure 12A:
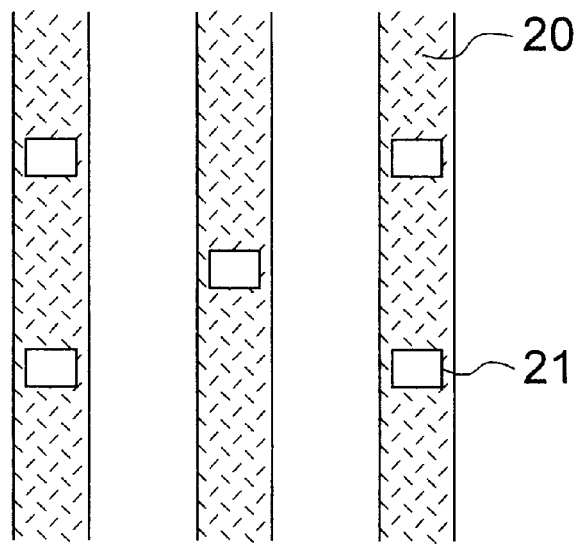
FIGS. 12A to 12D are diagrams showing a part of a semiconductor integrated circuit manufacturing process to which the present invention is applied.
Figure 12B:
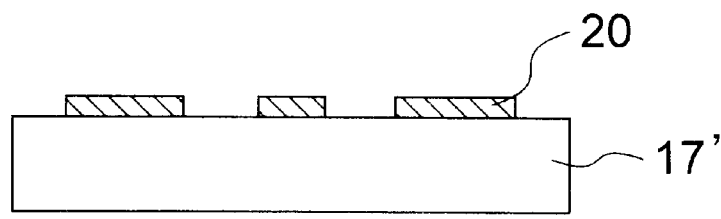
Figure 12C:
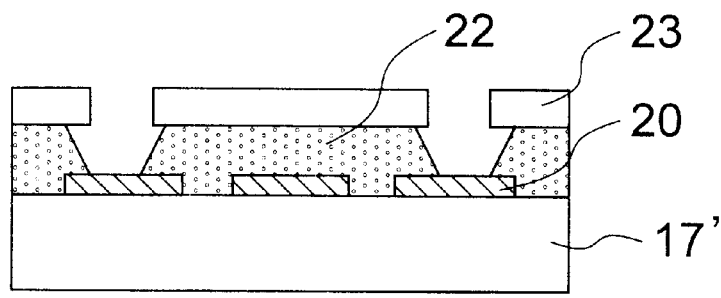
Figure 12D:
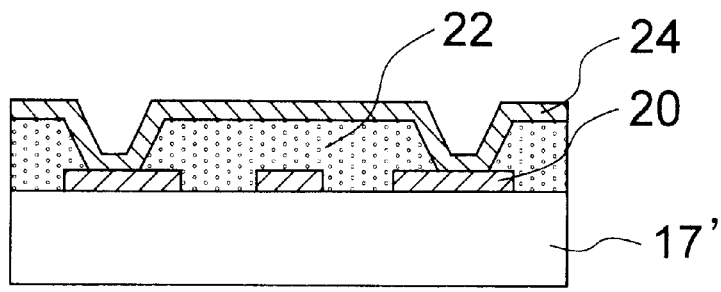

FIG. 12A is a top view and FIGS. 12B to 12D are cross-sectional views illustrating a semiconductor integrated circuit manufacturing process to which the present invention is applied.

In the semiconductor integrated circuit manufacturing process, a metal interconnection shown in FIG. 12A, e.g. aluminum interconnection 20 is exposed and formed by the optical exposure system, and a through-hole 21 is bored by the electron beam lithography system in this interconnection layer. The reason that the electron beam lithography system is used in the process for forming the pattern of the through-hole layer is that, since this layer comprises the array of isolated hole patterns, the application of a phase-shift technique is difficult in the exposure done by the optical exposure system, thereby making it difficult to resolve the pattern.

FIGS. 12B to 12C are cross-sectional views of these processes. FIG. 12B shows the state in which the aluminum interconnection 20 is formed on a sample 17' by the optical exposure system. Then, as shown in FIG. 12C, an interlayer insulator 22 is formed on the sample 17' and the aluminum interconnection 20 and a resist 23 is coated on the interlayer insulator 22. Then, a through-hole pattern is written on the resist 23 by electron beams and developed. FIG. 12C shows the state of the cross-section obtained after the developed resist 23 is used as a mask and the etching is carried out. Thereafter, as shown in FIG. 12D, the resist is stripped and an aluminum 24, which is the interconnection material of the next layer is vapor-deposited. In FIG. 12D, the lower aluminum interconnection 20 and the upper aluminum interconnection 24 are interconnected by the portion of the through-hole 21.

In the so-called mix-and-match process in which the above-mentioned different lithography techniques are combined in use, it is important to match a positional relationship between the pattern of the through-hole and the pattern of the aluminum interconnection with high accuracy. In particular, since most of the pattern of the aluminum interconnection exposed by the optical exposure system is comprised of the 0.3 μm line-and-space of one direction (see the central portion of FIG. 1A) and the peripheral portion is comprised of patterns with different spatial frequencies (see the upper left portion of FIG. 1A), initially, there was produced the standard wafer for measuring a lens distortion inherent in the optical exposure system being used.

Figure 2:
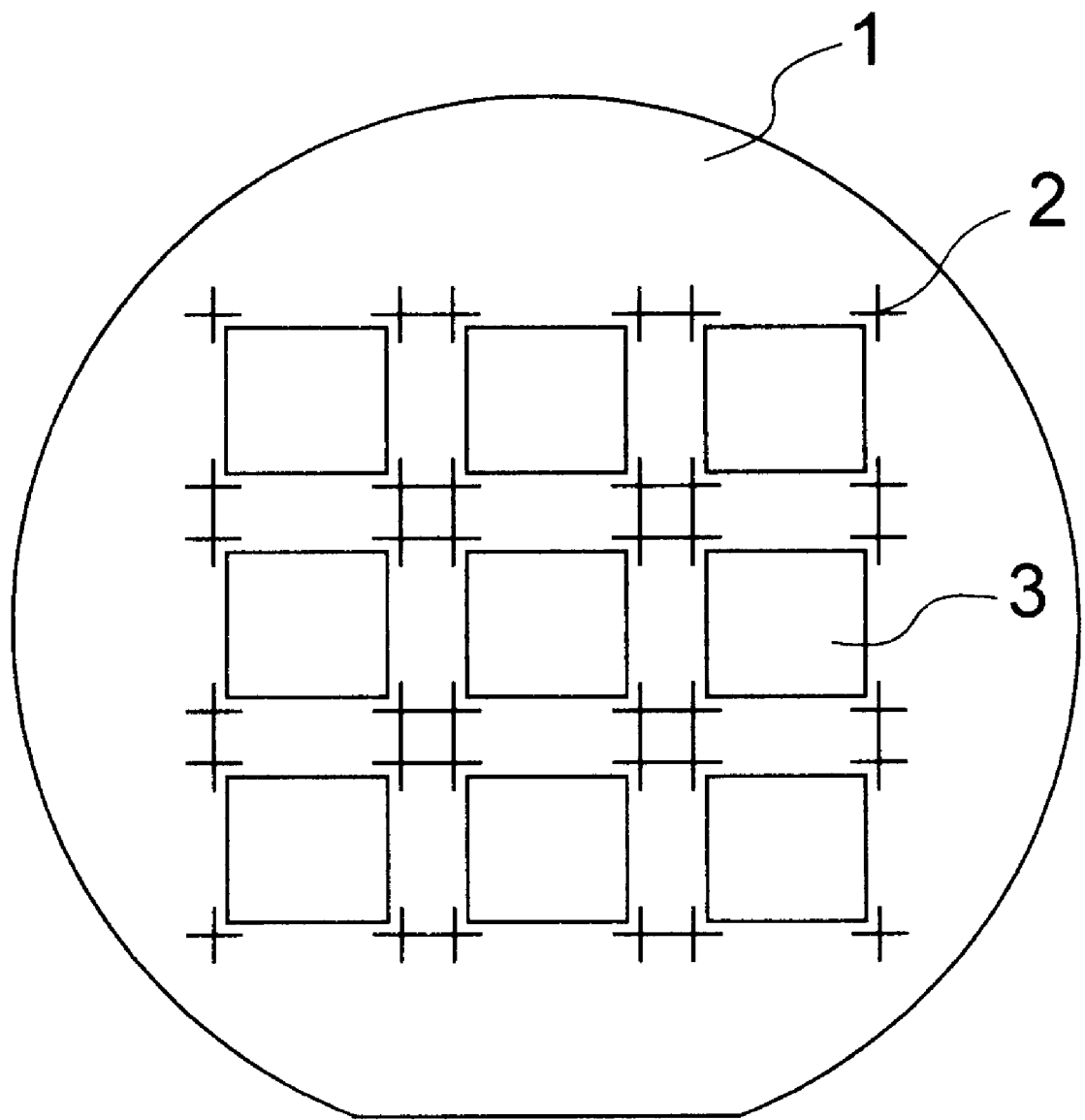
FIG. 2 is a diagram showing an example of a conventional alignment lithography.
Figure 3:
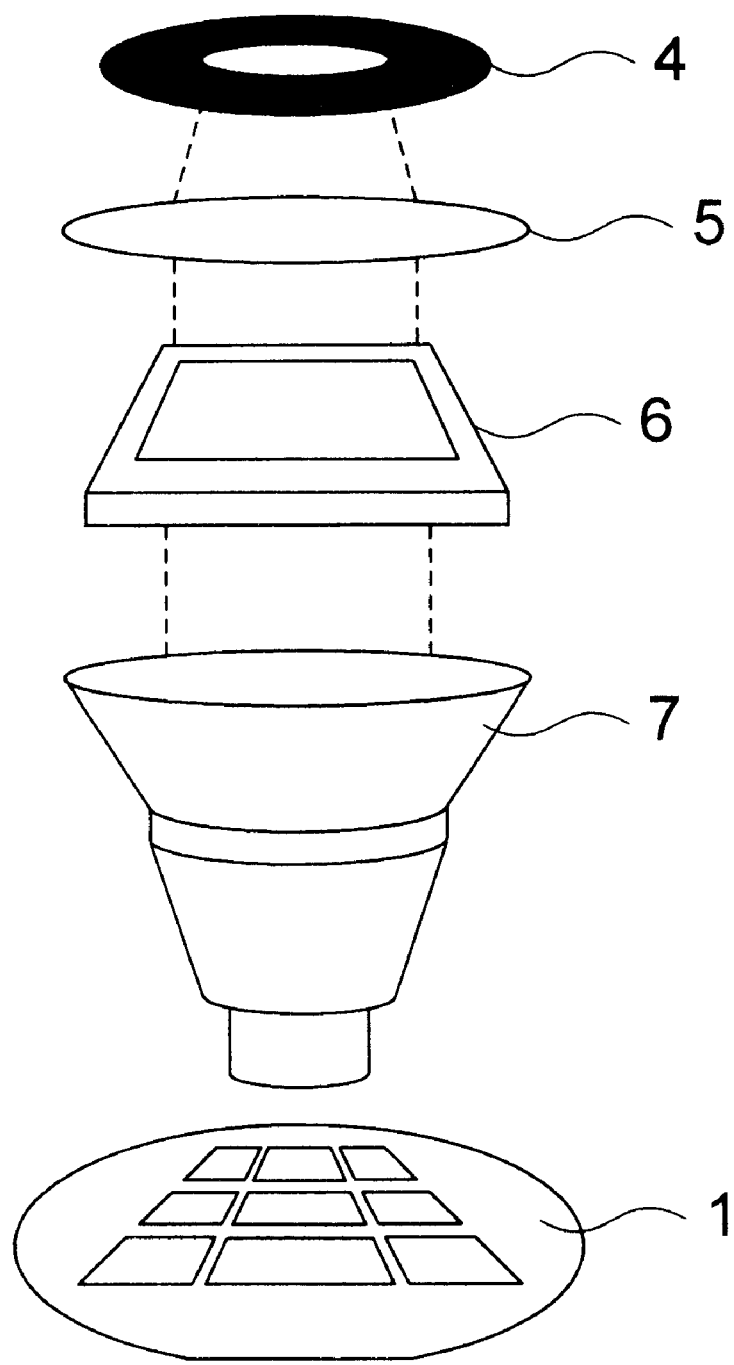
FIG. 3 is a perspective view showing a structure of an optical exposure system.
Figure 4:
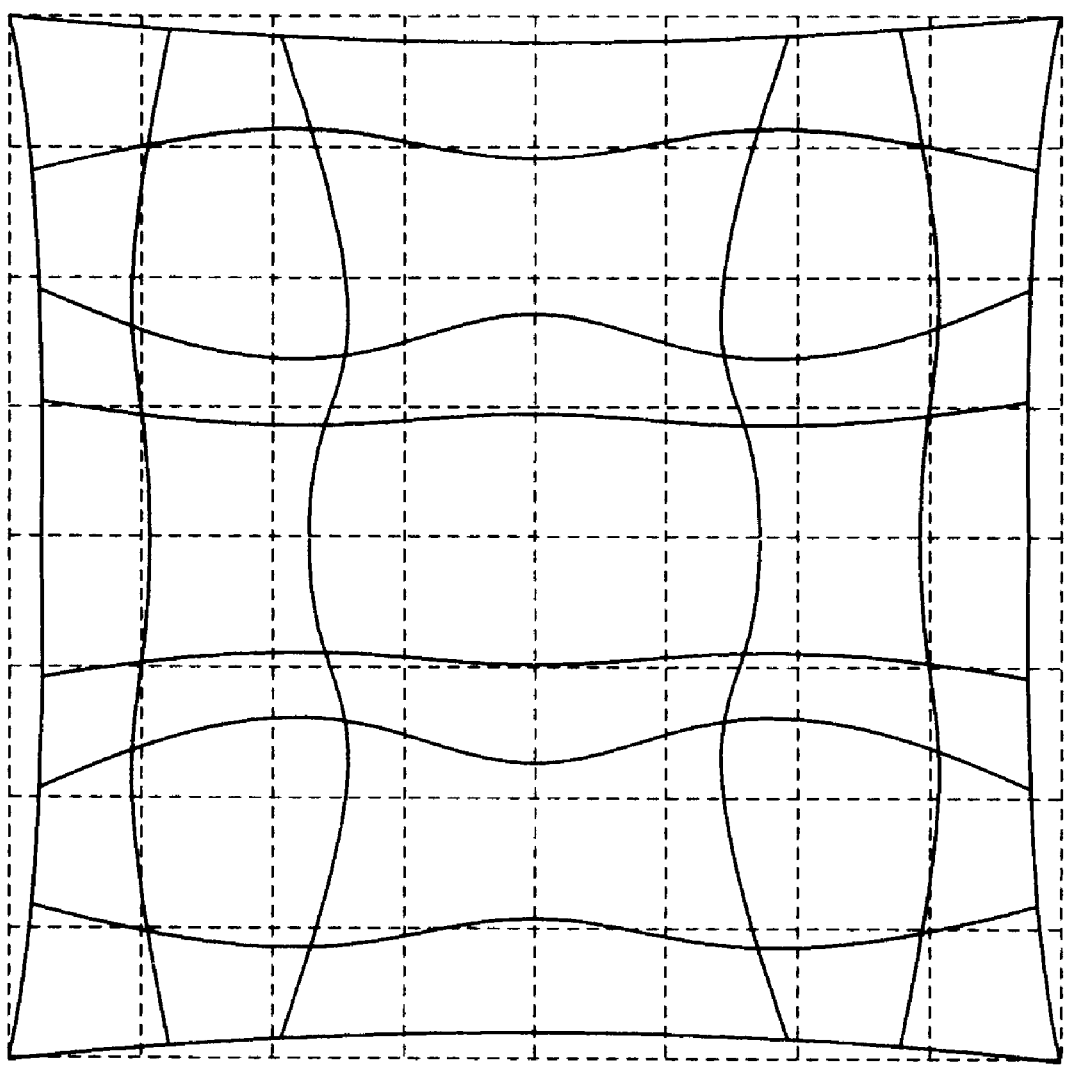
FIG. 4 is a diagram used to explain features of a pattern exposed by the optical exposure system.
Figure 5A:
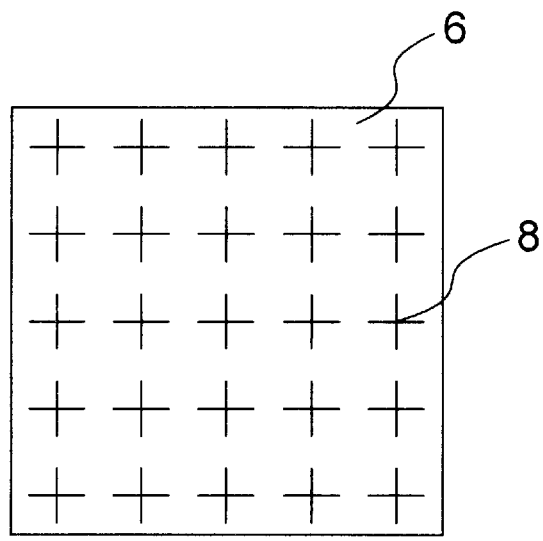
FIGS. 5A and 5B are diagrams used to explain a method of measuring a shape of a distortion obtained by the optical exposure system.

In order to measure a distortion, there was exposed the standard pattern 6 containing the distortion measurement mark 8 shown in FIG. 5A. A part of the mark 8 is comprised of the same 0.3 μm line-and-space as that of the aluminum interconnection. In order to obtain a satisfactory mark detection waveform, the exposed pattern was etched by a depth of 0.5 μm.

FIGS. 13A to 13D are diagrams showing examples of marks which are used to evaluate the exposure distortion according to the present invention.

Figure 13A:
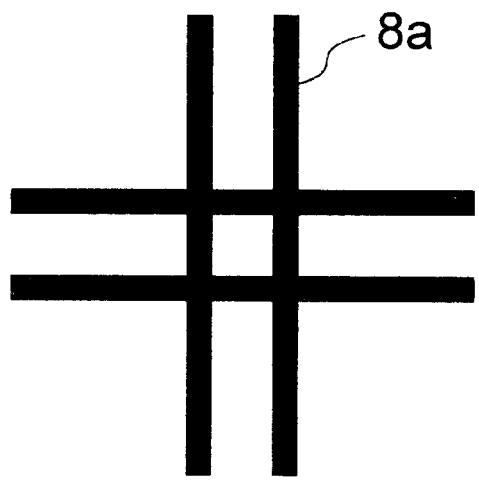
FIGS. 13A to 13D are diagrams showing examples of shapes of marks used to evaluate exposure distortions according to the present invention.

An ordinary mark has a simple cross-shaped or double-cross-shaped plan shape 8a shown in FIG. 13a. However, according to this shape, it is not possible to measure the distortion which changes depending upon the pattern features. The distortion of the pattern comprised of the line-and-space, for example, becomes different from the distortion measured by this mark. In order to measure such pattern dependence, it is necessary to use a mark comprised of the same features as those of the pattern contained in the product pattern and which is suitable for measuring the position.

Figure 13B:
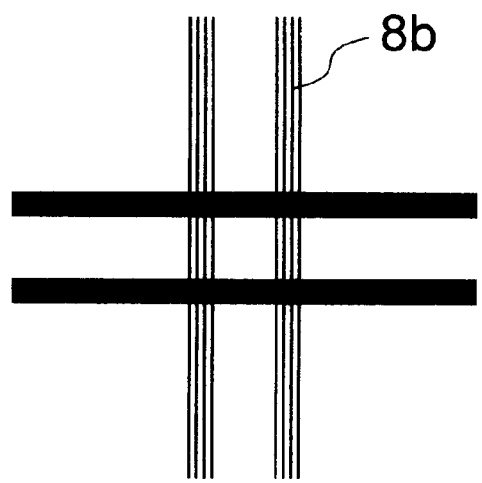
Figure 13C:
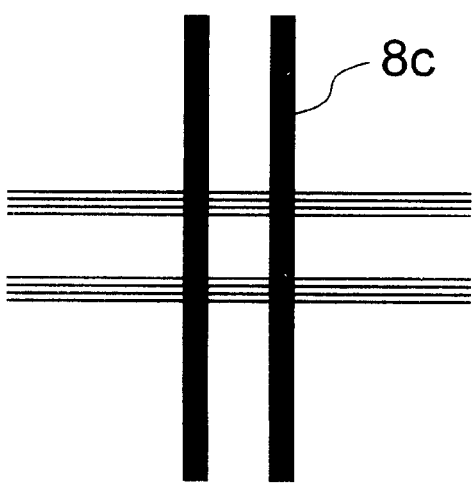
Figure 13D:
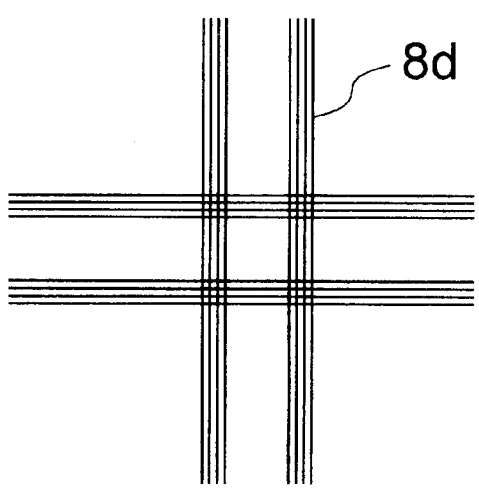

When the distortion of the line-and-space pattern is measured, for example, in addition to the ordinary mark 8 shown in FIG. 13A, it is preferable to use marks 8b, 8c, 8d in which a part of the mark is comprised of similar line-and-space as shown in FIGS. 13B, 13C, 13D. Incidentally, all of these marks need not be always used. If one combination of the marks 8a and 8d or 8b and 8c is used, then there can be obtained the mark group which includes all different patterns. The line width and the space width should be properly modified in accordance with the size f the product pattern being corrected. By scanning this mark with electron beam, it becomes possible to calculate the center position of the mark.

Figure 14A:
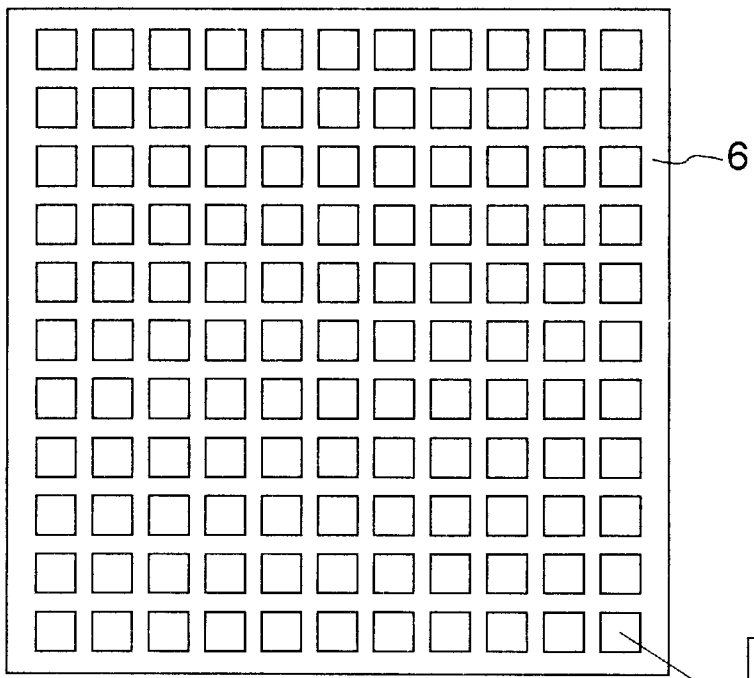
FIGS. 14A and 14B are diagrams showing standard patterns for measuring a distortion according to the present invention.
Figure 14B:
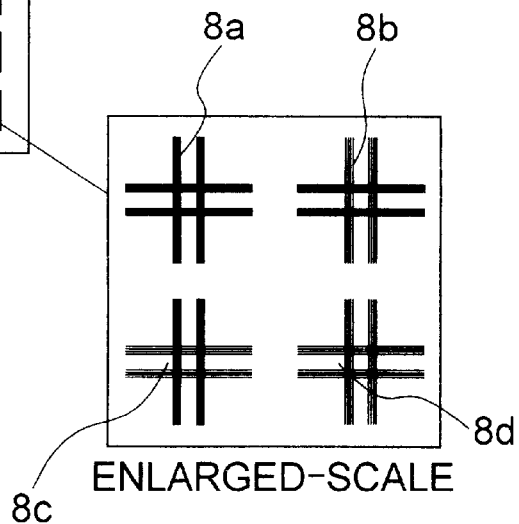

FIGS. 14A and 14B are diagrams used to explain the standard pattern for measuring a distortion according to the present invention.

In this embodiment, a repeated pattern comprising a plurality of marks 8a to 8d shown in FIG. 14B in an enlarged-scale is disposed on the mark 6a shown in FIG. 14A in a lattice shape. By exposing pattern on this mask onto the wafer with the optical exposure system to thereby measure a displacement of each mark position from the ideal lattice, it becomes possible to measure the distortion state depending upon the pattern features.

Next, the lens distortion was measured by using the standard wafer 6 produced as shown in FIG. 14A. A mark detection function of the electron beam lithography system was used to measure the distortion. That is, the standard wafer 6 was set on the stage within the electron beam lithography system, the mark 8a arranged in the lattice shape was transported into a beam scanning range by moving the stage, and the mark position was detected by scanning beams. A distortion of the exposure system was obtained from a difference between the mark coordinates thus obtained and the detected coordinates. Similarly, a distortion was calculated by detecting the mark 8b containing the structure of the 0.3 μm line-and-space, and a distortion applicable to the pattern shape of the transferred aluminum interconnection portion was measured. Measured data were saved in a hierarchical fashion at every stepper of the exposure system, exposure conditions and pattern condition used in the measurement.

Next, there was produced correction data of the pattern written by electron beams (see FIGS. 1A to 1C). The pattern exposed by the optical exposure system of the underlayer is the halftone shape shown in FIG. 1A. However, in the portion of the peripheral circuit (see upper left portion), there are disposed the patterns of large size. As a result, as shown by broken lines in FIG. 1A, the pattern was divided into meshes and correction values of coordinates represented by the center of mesh as shown in FIG. 1B were determined. In the portion in which the patterns within the divided meshes are occupied by the line-and-space, the distortion amount in the corresponding coordinates is set from the results of the distortion measured by the mark 8b shown in FIG. 14B. In the portion of the peripheral circuit, the distortion amount in the corresponding coordinates was set from the results of the distortion measured by the mark 8a. As described above, based on the features of the underlayer pattern, correction data was created by combining the distortion data of the mark 8a and the distortion data of the mark 8b, and data was saved in the hard disk connected to the control workstation of the electron beam lithography system.

Then, the hole pattern was written by electron beams. When the aluminum interconnection of the underlayer was formed, the positioning marks were simultaneously exposed at the four corners of the chip. These marks were detected, the position of the underlayer was confirmed, and then the hole pattern was written. When the hole pattern was written, the aforementioned correction data was read in and the deflection amount of electron beams was controlled in such a manner that the pattern being written was matched with the positional relationship with the underlayer, and the written pattern was distorted in accordance with the distortion of the underlayer and written. As a result, while the alignment accuracy between the aluminum interconnection of the underlayer and the hole pattern was 60 nm, as a result of this correction, the alignment accuracy was improved up to 40 nm, and the improvement of yield was confirmed.

Other application example of manufacturing a semiconductor integrated circuit according to the present invention will be described next.

In the semiconductor manufacturing process shown in FIGS. 12A to 12D, the aluminum interconnection and the through-hole layer were formed by the same optical exposure system. As mentioned before, the optical exposure system has different shapes of distortions generated upon exposure depending upon the mask pattern, and is difficult to obtain a satisfactory alignment accuracy. In particular, in the interconnection pattern comprising the hole pattern in which isolated graphic forms are continuous and the line-and-space, the spatial frequency of the pattern is considerably different and a difference of distortion shape is large. Accordingly, the distortion of the exposure system in each pattern was measured, the mask pattern was modified in such a manner that a distortion obtained when the pattern was exposed based on distortion data becomes minimum, and then the mask was produced by the electron beam mask lithography system.

Figure 5B:
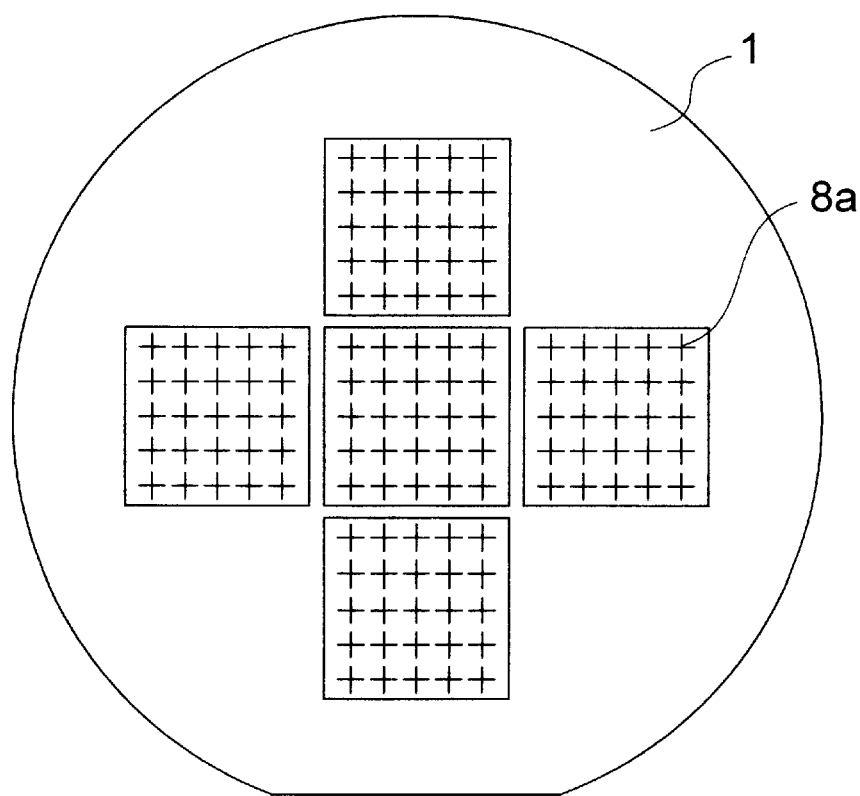

Initially, there was produced the standard wafer 1 for measuring a distortion. The above-mentioned standard pattern 8a shown in FIG. 5B was exposed under exposure conditions similar to those used when the aluminum interconnection was exposed in actual practice, and then etched. A lens distortion was measured by using the thus created standard wafer 1. In order to measure the distortion of the aluminum interconnection, there was used the mark 8b (see FIG. 13B) in the standard wafer 1. Also, in order to measure a distortion corresponding to the peripheral circuit of the pattern of the aluminum interconnection, a distortion was measured with respect to the mark 8a. On the other hand, in order to measure the distortion of the hole layer, of the exposed standard patterns, the position of the mark 8a was measured similarly, and the distortion within the exposed field was calculated. Correction data was created based on the measured distortion. In the method of creating correction data, as shown in FIGS. 1A to 1C, the pattern is divided as mentioned before, and the correction amounts at respective positions corresponding to the respective pattern features are determined.

In this embodiment, as the optical exposure system, there is used such an optical exposure system in which the mask pattern is demagnified to ⅕ and then transferred. In order to correct the pattern for writing the mask such that a transferred distortion becomes minimum, as shown in FIGS. 11A and 11B, the correction amount was set such that the positive and negative polarities of correction data are reversed and the amount obtained by enlarging the demagnified mask pattern 5 times is calculated. According to the above-mentioned method, there were created correction data corresponding to the respective patterns and exposure conditions.

Then, the mask was created based on the correction data. The mask was created by using the electron beam mask lithography system. When the respective patterns are written, the correction data thus respectively calculated are set, and the pattern writing position is corrected by the beam deflection amount. Although the created mask becomes such one that a distortion correction amount is superimposed upon the design pattern, the distortion of the pattern exposed by this mask becomes minimum, and this pattern can become a satisfactory pattern with less distortion. As a result of applying these masks to the semiconductor manufacturing processes shown in FIGS. 12A to 12D, according to the conventional method, i.e. the method in which the correction is not effected, while the alignment accuracy between the interconnection layer and the hole layer becomes larger than 100 nm, according to this embodiment, i.e. the method in which the mask written in such a manner that the distortion becomes minimum, the alignment accuracy of less than 50 nm can be constantly obtained, and it becomes possible to manufacture a semiconductor integrated circuit with high yield.

As set forth above, according to the present invention, it becomes possible to write the pattern in accordance with the distortion which changes depending upon the exposure conditions of the optical exposure system and the features of the exposed pattern. Since the electron beam lithography system and the optical exposure system are used in the mix-and-match, high accurate alignment becomes possible. Also, when the combined exposure is executed by only the optical exposure system, the pattern can be exposed with less influence of the lens distortion, and high accurate alignment between layers becomes possible. As a result, as the alignment accuracy is improved, it becomes possible to manufacture a semiconductor integrated circuit with high yield.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. An exposure method for exposing a pattern using a plurality of exposure systems, said method comprising the steps of:
    a first measurement step including a step for exposing a reference pattern for measuring exposure distortion amounts that vary depending upon the spatial frequency of said exposure system, and a step for measuring exposure distortion amounts of the reference pattern exposed by a first one of said exposure systems;
    a first exposure step for exposing a first circuit pattern having distortion on a substrate using said first exposure system; and
    a second exposure step for exposing on the substrate a second circuit pattern having distortion in alignment with the distortion of the first circuit pattern using said second exposure system including correcting the exposing of the second circuit using the measured exposure distortion amounts.

2. An exposure method according to claim 1, wherein said first exposure step is performed using an optical projection exposure system as said first exposure system.

3. An exposure method according to claim 1, wherein said second exposure step uses an electron beam lithography system having electron beam irradiation as said second exposure system.

4. An exposure method according to claim 1, wherein said first exposure step divides the exposed pattern into regions, calculates characteristics of the pattern in the divided regions, determines correction amounts by using the characteristics of the pattern and position within the divided region as a parameter and wherein the second exposure step uses the correction amounts in the correcting of the exposing of the second circuit pattern.

5. An exposure method according to claim 1, wherein said measuring step includes determining a position offset amount from a design value of the reference pattern and using said position offset amount in said correcting of the exposing of the second circuit.

6. A semiconductor device manufactured by using the semiconductor manufacturing method claimed in claim 1.

7. In a semiconductor manufacturing method in which, when a pattern is written by an electron beam lithography apparatus in alignment with an underlayer pattern exposed by an optical projection exposure system, a distortion correction standard pattern composed of a plurality of marks each having a different spatial frequency is exposed in advance using said optical projection exposure system, a standard mark position of a wafer is measured and a pattern is written by electron beams by correcting a writing position based on measured distortion, comprising the step of:

writing a pattern by adjusting a correction amount corrected by said electron beam lithography apparatus in accordance with optical distortion that changes in response to at least one of underlayer exposure conditions and an exposed pattern shape when the distortion correction standard pattern is exposed.

8. In a semiconductor manufacturing method in which different pattern layers of a semiconductor element are formed by using a plurality of different optical projection exposure systems, said semiconductor manufacturing method comprising the steps of:

measuring a standard mark position of a wafer by exposing a distortion correction standard pattern by the light projection exposure system; and correcting a mask writing position so that an exposure distortion of a pattern exposed in a manufacturing process is minimized.

9. A semiconductor manufacturing method for forming pattern layers by utilizing a plurality of exposure systems, said method comprising the steps of:

a first measurement step including a step for exposing a reference pattern for measuring exposure distortion amounts that vary depending upon the spatial frequency of said exposure system, and a step for measuring exposure distortion amounts of the reference pattern exposed by a first one of said exposure systems, while forming an arbitrary pattern in said semiconductor element pattern layers by using an optical projection exposure system;

a first exposure step for exposing an aluminum wiring pattern with distortion onto a wafer by using said optical projection exposure system;

a second exposure step for exposing on the water a pattern of holes having distortion in alignment with the distortion of the aluminum wiring pattern using a second exposure system, including correcting the exposing of the pattern of holes using the measured distortion amounts.

10. A semiconductor manufacturing method according to claim 9, wherein said first exposure step divides the exposed pattern into regions, calculates characteristics of the pattern in the divided regions, determines correction amounts by using the characteristics of the pattern and a position within the exposed region as a parameter, and wherein said second exposure step uses the correction amounts in the correcting of the exposing of the pattern of holes.

* * * * *